United States Patent
Ryshtun et al.

(10) Patent No.: US 8,773,405 B1
(45) Date of Patent: Jul. 8, 2014

(54) STYLUS AND RELATED HUMAN INTERFACE DEVICES WITH DYNAMIC POWER CONTROL CIRCUITS

(71) Applicant: Cypress Semiconductor Corporation, San Jose, CA (US)

(72) Inventors: Andriy Ryshtun, Lviv (UA); Victor Kremin, Lviv (UA); David G. Wright, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/035,240

(22) Filed: Sep. 24, 2013

Related U.S. Application Data

(60) Provisional application No. 61/751,146, filed on Jan. 10, 2013.

(51) Int. Cl.
  *G06F 3/033* (2013.01)
  *G06F 3/0354* (2013.01)
(52) U.S. Cl.
  CPC .................................. *G06F 3/03545* (2013.01)
  USPC ....................................... 345/179; 178/19.03
(58) Field of Classification Search
  None
  See application file for complete search history.

(56) References Cited

U.S. PATENT DOCUMENTS

| | | |
|---|---|---|
| 6,954,867 B2 | 10/2005 | Casebolt et al. |
| 8,089,461 B2 | 1/2012 | Beard et al. |
| 8,493,359 B2 | 7/2013 | Wright et al. |
| 2011/0032210 A1 | 2/2011 | Chou et al. |
| 2012/0050207 A1 | 3/2012 | Westhues et al. |
| 2012/0062499 A1 | 3/2012 | Weaver et al. |
| 2012/0068964 A1* | 3/2012 | Wright et al. ................ 345/174 |
| 2012/0331546 A1 | 12/2012 | Falkenburg et al. |
| 2013/0169601 A1 | 7/2013 | Mo et al. |

FOREIGN PATENT DOCUMENTS

CA    2790387 A1    4/2013

OTHER PUBLICATIONS

Hothardware.com, Apple Files Patent for "Active Stylus" for Use with iPods, iPhones and iPads, Jan. 2, 2013, Internet at http://hothardware.com/News/Apple-Files-Patent-for-Active-Stylus-For-Use-with-iPods-iPhones-and-iPads.
Samsung Electronics U.S.A, S Pen SDK, Feb. 27, 2013, Internet at http://developer.samsung.com/s-pen-sdk/sdk/ S-Pen-SDK-2-3#.

* cited by examiner

Primary Examiner — Adam R Giesy

(57) ABSTRACT

A device comprising a body comprising an elongated housing with at least a first conductive tip formed at a distal end and at least one sense electrode on the body; a capacitance sense circuit disposed within the housing and configured to sense a capacitance of the sense electrode to generate a proximity result in response to contact with a human body; and a signal generator circuit disposed within the housing and configured to activate a position signal in response to the proximity result, the position signal being driven at the tip of the device.

19 Claims, 11 Drawing Sheets

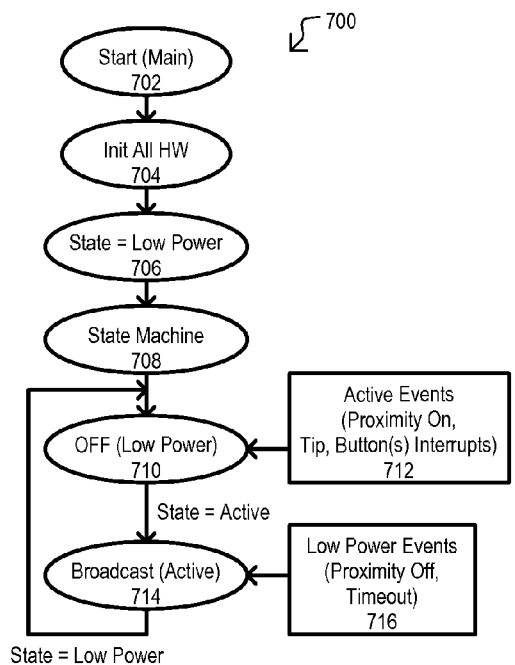
FIG. 7
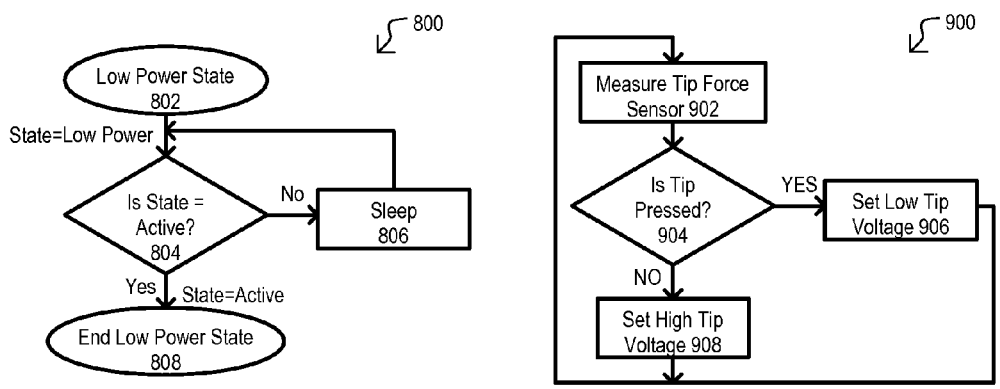
FIG. 8
FIG. 9

STYLUS AND RELATED HUMAN INTERFACE DEVICES WITH DYNAMIC POWER CONTROL CIRCUITS

This application claims the benefit of U.S. provisional patent application Ser. No. 61/751,146 filed on Jan. 10, 2013, the contents of which are incorporated by reference herein.

TECHNICAL FIELD

The present disclosure relates generally to human interface devices, and more particularly to styluses and related pointing devices.

BACKGROUND

The use of a stylus with touchscreens is well known, but existing technologies can have the disadvantages of cost, performance and/or reliability. Resistive touchscreens can be well suited for use with a passive (i.e., non-powered) stylus. The PalmPilot personal digital assistant (PDA), launched in 1997, was one of the first devices with a resistive touchscreen designed for use with a stylus, and helped to popularize that technology. However, resistive touchscreens have many disadvantages, and are increasingly being replaced by capacitive touchscreens.

Capacitive touchscreens can support the use of a passive stylus, but in many cases, can require a minimum stylus tip size (e.g., 5 mm). Such a size can be much larger than a pen-like tip (e.g., 1 mm) desired in many applications.

Various tethered active (i.e., powered) stylus approaches have been deployed for use with capacitive touchscreens, and have been included in applications such as point-of-sale terminals (e.g., the signature pad used for credit card transactions in larger retail stores) and other public uses. However, the need for a cable (i.e., that tethers the stylus to a host device) can be a significant drawback for "private" applications such as tablets, personal computers (PCs), and smartphones.

Conventional technologies used in tethered applications can fall broadly into two categories: inductive and electrostatic. In inductive technologies, stylus sensing is implemented largely independently of the finger-sensing capability of the touchscreen. Typically, an AC signal is generated and fed to the tip of the stylus, and sensors behind or around the display receive the signal. A relative magnitude of the received signal at each of the sensors can then be used to interpolate the position of the stylus tip. In electrostatic technologies, an electrostatic field is generated at the tip of the stylus which is detectable by a self-capacitance touchscreen, as if the stylus tip was larger than it actually is. In effect, the electrostatic field is used to magnify the effective size of the stylus tip as detected by the self-capacitance sensing touchscreen system.

In order to meet the performance requirements demanded by many recent latest applications, touchscreens are rapidly migrating to mutual capacitance sensing—or a combination of self and mutual capacitance sensing.

Some conventional tether-free styluses have used a magnetic antenna for the synchronization signal for a host-to-stylus transmission. Synchronization is done by using a 13.56 MHz amplitude shift keying (ASK) signal. Two antennas are used. A transmitter antenna is implemented as 1÷3 turns coil, embedded in an indium tin oxide (ITO) portion of a touch screen panel routed at the host side. A receiver antenna is a coil placed inside the stylus. A drawback to such a conventional approach can be the high cost and complicated mechanical construction of the transmitter antenna.

Another type of stylus is a self-synchronized active stylus (SSAS). An SSAS can generate a square wave signal on a stylus tip. The signal waveform phase and frequency are not synchronized with the host. A host touch screen controller can receive the square wave signal and calculate a stylus touch position based upon the signal. One conventional SSAS system will now be described with reference to FIGS. 21A and 21B.

FIG. 21A shows a host end of a system 2100. A sense (ITO) panel 2101 can be connected to a selective receiver 2103. A sense panel 2101 can include a number of receive lines. Selective receiver 2103 can detect the panel receive line(s) with the maximum received signal to determine a stylus position. A detected stylus signal can also include force data which can be decoded by decoder 2105. A host CPU 2107 can provide force and position (Touch Signal) data for an application run by the host device 2109.

FIG. 21B is a block diagram of a conventional SSAS 2111. Conventional SSAS 2111 is an "active" stylus, and thus generates a signal for transmission to sense panel. A reference clock 2119 can generate signal that can be amplified by amplifier 2121 and driven on a stylus tip 2123, and thereby supplied to a host sense (i.e., ITO) panel. A stylus 2111 can also include a force sensor 2113 to detect the force at the stylus tip 2123 that is measured by measurer 2115. Force data are transmitted by modulating the carrier frequency with a modulator 2117. The signal transmitted by the stylus 2111 can induce a signal in the sense panel 2101 of the host system 2100, for subsequent decoding. Stylus 2111 can be powered by from a battery.

A drawback to a conventional SSAS like that of FIG. 21B can be limited life due to power consumption.

BRIEF DESCRIPTION OF THE DRAWINGS

FIG. 7 is a state diagram showing main operations of a HID according to an embodiment.

FIG. 8 is a state diagram showing power states of a HID according to an embodiment.

FIG. 9 is a state diagram showing dynamic tip voltage control for a HID according to an embodiment.

DETAILED DESCRIPTION

Various embodiments will now be described that show human interface device (e.g., stylus) having a position indicating part (e.g., tip), in which the device can switch between a low power and active mode based upon whether the device is handled or touched by the human body. By utilizing a low power mode, power consumption can be reduced.

According to some embodiments, a body of the device can be used as a capacitance sense electrode to detect the proximity of a human body part (e.g., hand). Upon detection of a body part, the device can switch to an active mode, and transmit a position signal from a position indicating end (e.g., tip). Further, once the position indicating end comes in contact with a sensing area (e.g., host sense surface), a position signal amplitude can be reduced.

In some embodiments, the device can be a stylus having a sense electrode on an outer surface for sensing the grasp of a human hand. In a particular embodiment, a stylus body and tip can be a contiguous structure, formed of metal (or another conductive material), and serve as the sense electrode. In other embodiments, a stylus can include a nonconductive body surrounded by a conductive material (e.g., a conductive polymer or the like) which serves as the sense electrode.

Figure 1A:
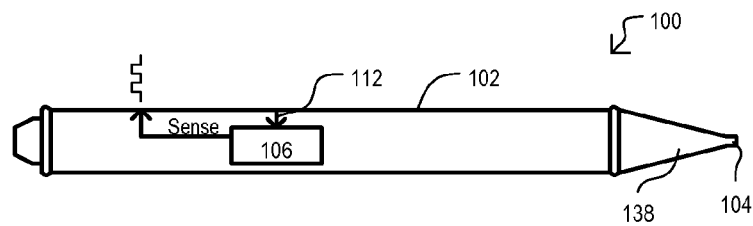
FIGS. 1A to 1C are a sequence of diagrams showing a human interface device (HID) and operations according to an embodiment.
Figure 1B:
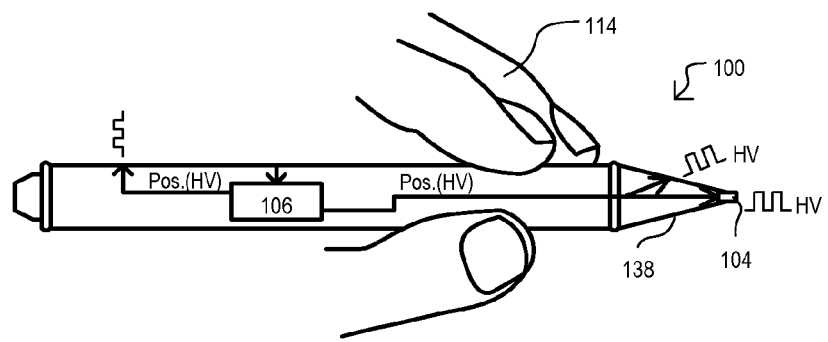
Figure 1C:
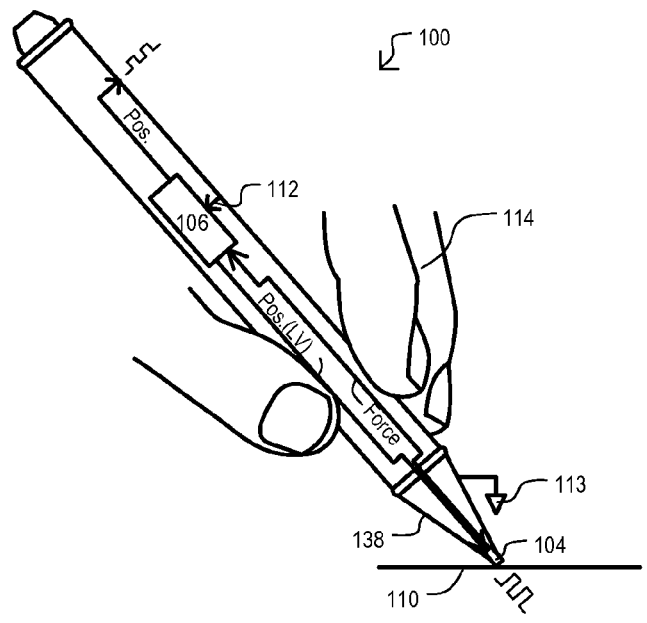

Referring to FIGS. 1A to 1C, a human interface device 100 according to an embodiment is shown in a series of diagrams. Device 100 can be a stylus that includes a sense electrode 102, a position indication part (hereinafter "tip") 104, and a control electronics 106. In the particular embodiment shown, device 100 can also include a shield electrode 138. A sense electrode 102 can form all, or part, of a body of the device 100. Alternatively, a sense electrode 102 can be formed on the device. In some embodiments, the sense electrode 102 can form an outer surface of the device 100, and a human body can come into direct contact with the sense electrode 102. However, in other embodiments, a device 100 can include an insulating layer formed on the sense electrode 102, and a human body part does not directly contact the sense electrode 102. In some embodiments, a sense electrode 102 can be formed on an inner surface of the body. A sense electrode 102 can be formed of any suitable conductive material, including but not limited to: a metal (including an alloy) or a conductive polymer. A sense electrode 102 can be positioned on and/or cover a sufficient outer area of the device 100 to detect when it is handled by a user.

A tip 104 can indicate a position when used in conjunction with a host device sense array (not shown), and can be formed of a conductive material. In some embodiments, a tip can be part of a conductive body that also includes the sense electrode. For example, a stylus body can be a contiguous metal structure that is hollow and comes to a point at the tip 104. In other embodiments, a tip 104 can be a separate structure from the sense electrode 102. A tip 104 can also include a force sensor to determine when the tip comes into contact with a surface, including the amount force applied. A shield electrode 138 can be formed proximate the tip, and be composed of a conductive material. A shield electrode and tip can be separate structures, or parts of the same unitary structure. Similarly, a shield electrode and a sense electrode can be separate structures, or parts of the same unitary structure.

Control electronics 106 can include circuits for switching the device 100 between low power and active modes based on a capacitance sensing with the sense electrode 102. Control electronics 106 can also include a power source for powering such circuits. In some embodiments, all of the control electronics, including a power source, can be formed within the body of the device 100. In such embodiments, the stylus can be considered "untethered". Particular circuits of the control electronics 106 will be described in more detail below.

FIG. 1A shows a device 100 in a low power mode. In a low power mode, control electronics 106 can drive sense electrode 102 with a sense signal (Sense), and monitor a capacitance of sense electrode 102 via monitor path 112. In particular embodiments, a sense signal can be a time varying signal, and control electronics 106 can include an integrator circuit for determining a capacitance at sense electrode 102 based on the sense signal (Sense). A device 100 can be in a low power mode in any of the following states: upon power up, when not being handled, or after a certain amount of inactivity (timeout condition).

FIG. 1B shows a device 100 when it is handled, but not in contact with a host sense array surface. Upon contact by human body parts 114, a capacitance of sense electrode 102 will change significantly (i.e., capacitance will increase). Control electronics 106 can sense the increase via monitor path 112, and in response, enter an active mode. In an active mode, control electronics 106 can drive a first position signal (Pos(HV)) at tip 104. Such a signal can be detected (e.g., induce a response) by a host when in sufficient proximity to a host sense array, to thereby indicate a position of the device with respect to the host sense array. In some embodiments, a first position signal (Pos(HV)) can be a time varying signal. Further, a position signal (Pos(HV)) can be different than sense signal (Sense). For example, a position signal (Pos(HV)) can have a higher frequency and/or greater magnitude than a sense signal (Sense). However, in other embodiments, a sense signal (Sense) can be the same as a first position signal (Pos(HV)).

In the particular embodiment shown, a shield electrode 138 can be driven with the first position signal (Pos(HV)) in the active mode. As noted above, in other embodiments, shield electrode can be part of the same structure as the sense electrode, tip, or both.

In this way, a device with position indicating tip can switch from a low power mode to an active mode in response to the proximity of a body part. In particular embodiments, a stylus can switch from a low power mode to an active mode in response to being handled.

FIG. 1C shows a device 100 when a tip 104 comes into contact with a surface 110. A surface 110 can be formed over a host sense array, for example. Contact with surface 110 can be detected by a force sensor in tip 104 and signaled to control electronics 106. In response to such contact, a device 100 can be switched to a contact-active mode. In a contact-active mode, control electronics 106 can drive a second position signal (Pos(LV)) at tip 104. Such a signal can be a lower power signal than the first position signal (Pos(HV)). In a particular embodiment, second position signal (Pos(LV)) can be a lower voltage (lower amplitude) signal than a first position signal. In addition, in the embodiment shown, in the contact-active mode, control electronics 106 can connect the shield electrode 138 to a device ground 113.

In this way, a device with position indicating tip can switch from a higher power position signal to a lower power position signal upon contact with a surface, and ground a shield electrode.

Figure 2:
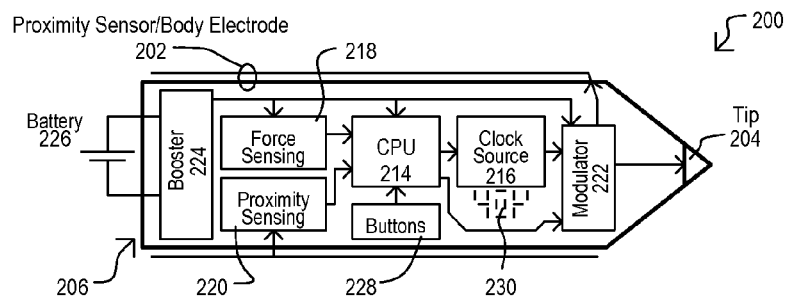
FIG. 2 is a block diagram of a HID according to an embodiment.

Referring now to FIG. 2, a stylus device 200 according to an embodiment is shown in a block diagram. Stylus 200 can include items like those of FIGS. 1A-1C, including a sense electrode 202 and tip 204, and control electronics. In the embodiment shown, control electronics can include a processing section 214 (shown as CPU, but any suitable processing circuits can be used), clock source 216, a force sensing circuit 218, a proximity sensing circuit 220, modulator 222, booster circuit 224, and battery 226. Stylus 200 also shows buttons 228. Buttons 228 can be one or more buttons that can be actuated to provide additional input functionality.

In some embodiments, a stylus 200 can be a self-synchronized active stylus (SSAS) that generates an internal, fixed frequency, filtered, rectangular position signal. Such a signal can be supplied to tip 204, and modulated to enable data to be included in the signal. In particular embodiments, a position signal at a tip 204 can create (induce) a current in the electrodes (e.g., indium tin oxide, ITO, electrodes) in a sense array of a host device (not shown). Such a current can be received by a controller (not shown), which can make a stylus tip position determination. A position signal emitted by a tip 204 may not be synchronized to a receiver (i.e., host) side by frequency, phase or amplitude.

Referring still to FIG. 2, a processing section 214 can perform a number of functions, including but not limited to: initializing and configuring the stylus 200 upon power on; power management; preparing force data for transmission in a position signal and/or varying operations/modes according to force data; detecting states of button(s) 228, varying operations/modes according to proximity sense values received from proximity sense circuit 220, and monitoring a power supply level. Initializing and configuring stylus 200 can include initializing the stylus 200 into a low power mode upon power on. Power management functions can include switching off various circuits according to operational mode, disabling signals and/or controlling a signal form (i.e. frequency and/or amplitude). In particular embodiments, power management functions can include placing stylus 200 into a low power sleep mode, and waking the stylus from such a mode in response to particular inputs.

Proximity sense circuit 220 can utilize a sense electrode 202 to detect the proximity of a human body (e.g., determining when the stylus is handled). Such proximity sensing results can be used by processing section 214 for power management functions. For example, upon sensing a human body, the stylus 200 can switch from a low power mode to an active mode. In some embodiments, a proximity sense circuit 220 can always be on, continually detecting a capacitance at sense electrode 202. In other embodiments, proximity sense circuit 220 operations can vary according to mode. For example, in a low power mode, proximity sensing circuit 220 can consume less power, while in the active mode the circuit can consume more power. In a very particular embodiment, in a low power mode, a proximity sense circuit 220 can sense a lower frequency signal, while in an active mode, a proximity sense circuit 220 can sense with a higher frequency signal.

A clock source 216 can provide one or more time varying signals for use by a stylus 200. For example, a time varying signal can be applied to sense electrode 202 for capacitance sensing of a human body. Further, the same, or a different signal, can be provided to tip 204 as a position signal that induces a response on a host sensing surface. In one very particular embodiment, a clock source 216 can provide two square wave signals shifted by 180 degrees from one another. In some embodiments, a clock source 216 can be connected to an oscillation source 230, such as a crystal, as but one very particular example.

A force sensing circuit 218 can measure a force applied at tip 204. A sensed force value can be used for various functions. A sensed force value can be used to alter a mode of operation of the device 200 (switch from a low power state to an active state). In addition or alternatively, a force value can be converted to a digital value and encoded in a position signal emitted from tip 204. Still further, a force value can be used to dynamically change an emitted position signal (e.g., change a position signal magnitude when the tip contacts a surface, or according to proximity to the surface). In one very particular embodiment, a force sensing circuit 218 can covert force values into digital values of 8-12 bits for encoding in a position signal.

Modulator 222 can modulate a position signal provided to tip 204 to enable such a signal to transmit data to a host device. Such data can include any suitable data value indicating stylus state and/or positions. As but a few examples, modulated data can indicate a sensed force at tip 204, a power state (e.g., battery bad indication, battery level), a state of any of the button(s), or a device identification value. Such data can be extracted from the position signal by a host device for use by an application. In some embodiments, a modulated signal can be applied to sense electrode 202 as a sense signal.

Button(s) 228 can include one or more input buttons on the stylus 200. Such buttons can take any suitable form, including but not limited to: mechanical buttons or "touch" surface buttons (i.e., capacitance/resistive sense electrodes different from the sense electrode 202), for example.

A battery 226 can provide power to stylus 200. In one embodiment, battery 226 can fit within a stylus housing, along with all control electronics. A battery 226 can take any suitable power source form, including rechargeable or non-rechargeable batteries, as well as other power storing devices such as "supercapacitors".

In the particular embodiment of FIG. 2, stylus 200 can include booster circuit 224. A booster circuit 224 can increase a power supply voltage for control electronics as compared to that provided form battery 226. In one very particular embodiment, a booster circuit 224 can be programmed to provide output voltages of 1.8 V, 2.7 V or 5 V from a lower voltage (e.g., 1.5 V or lower) according to the integrated circuits used to implement the control electronics. In some embodiments, a booster circuit 224 can provide a dynamic power supply voltage, providing one power supply voltage in a first mode (e.g., low power mode) and another, higher voltage in a second mode (e.g., active mode).

In this way, a stylus according to embodiments herein, can include various features not present in conventional styluses, including but not limited to: a sense electrode to sense the proximity of a hand holding the stylus; active power management based on detecting the human hand and/or sensed force; dynamic control of a position signal emitted at a tip; and stylus power information encoded and transmitted through a position signal to a host.

Figure 3:
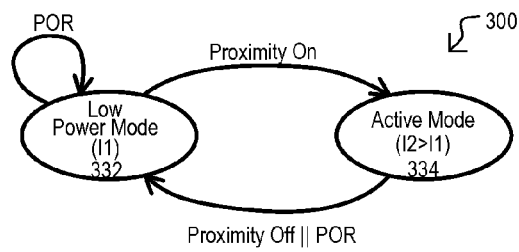
FIG. 3 is a state diagram showing power states of a HID according to an embodiment.

FIG. 3 is a state diagram 300 showing power control operations of a stylus according to one particular embodiment. Operations shown in FIG. 3 can be realized by a processing section included within the control electronics of a stylus, as described herein, or equivalents. As shown, a stylus can operate a low power mode 332 and an active mode 334. In a lower power mode 332, a stylus can draw a power supply current in a first range (I1). In an active mode 334, a stylus can draw a power supply current in a second range that is greater than the first range (I2>I1). In a very particular embodiment, low power current I1 can be in the range of 7 uA, while active current I2 can be in the range of about 78 uA.

Upon power-on or reset (POR), a stylus can enter low power mode 332. In one very particular embodiment, in a low power mode peripheral circuits (e.g., circuits other than a proximity sensing circuit and all or portions of a processing section) can be turned off, and a stylus can execute proximity sensing only (i.e., sleep until it is handled). In addition or alternatively, in a low power mode, a booster circuit can provide a minimal power supply voltage.

As shown by "Proximity On", upon detecting the proximity of a human body part (e.g., hand), a stylus can transition from the low power state 332 to the active state 334. In one very particular embodiment, in an active mode peripheral circuits can be enabled, allowing a position signal to be transmitted and other inputs to be detected (e.g., buttons, tip force, etc.). In addition or alternatively, in an active mode, a booster circuit can increase a power supply voltage (as compared to the low power state).

As shown by "Proximity Off", upon no longer detecting the proximity of a human body part, stylus can return to the low power mode.

According to embodiments, a device can include a sense electrode having the dual function of a proximity sensor and body electrode for the device. A sense electrode can have the feature of being sensitive to fingers, and not sensitive to other objects, such as metal objects that could be included in a transportation bag containing the device. According to embodiments, proximity sensing can discriminate finger touches from other conductive objects using a surrounding conductive sense electrode on an outer surface of the device. A difference between fingers and metal can be a number of touch points. When handled, a stylus can be touched in multiple locations (e.g., three points) as opposed to a smaller number of locations (e.g., one or two points), as could happen when the device is on the table or in bag with other conductive objects.

In some embodiments, distinguishing between fingers and other objects can be based on a sensed capacitance. In addition or alternatively, distinguishing between fingers and other objects can be based on a sensed capacitance of multiple sense electrodes on an outer surface of a device.

Figure 4:
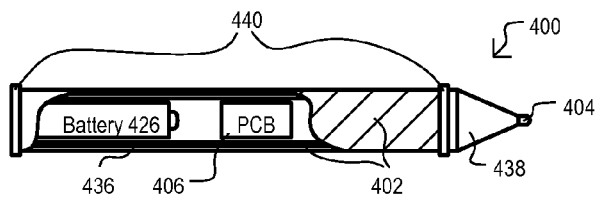
FIG. 4 is a partial side cross sectional view of a stylus device according to an embodiment.

FIG. 4 is partial cross sectional view of a stylus 400 according to another embodiment. A stylus 400 can include a sense electrode 402, a tip 404, control electronics 406, battery 426, housing 436, shield portion 438, and protection rings 440. A tip 404 can be a conductive structure with a force sensor. A shield portion 438 can be a tapering portion between a tip and a handled portion of the stylus 400. In some embodiments, a tip 404 and shield portion 438 can be an integral structure. In other embodiment such structures can be separate electrodes.

Control electronics 406 can provide the various functionalities described herein, or equivalents, including switching between modes based on proximity sensing by sense electrode 402 and/or force at tip 404. In the embodiment shown, control electronics 406 can be mounted on a printed circuit board (PCB) that fits within the housing 436 of the stylus 400. A battery 426 can fit within a housing 436, and is understood to have connections (not shown) to enable power to be supplied to control electronics 406.

A housing 436 can form the shape of the held portion of the stylus 400, and can have any suitable elongated shape, including but not limited to, shapes having a circular, oval, square or triangular cross sectional profiles. A sense electrode 402 can be a material formed on an outer surface of housing 436. A sense electrode 402 can be a contiguous structure, completely covering a portion of housing 436. In addition, a stylus 400 can include more than one electrode, or portions of same electrode, disposed at various locations on an outer surface of housing. It is understood that sense electrode(s) can be disposed on surface housing 436, be embedded within housing 436, or extend through housing 436 from an interior of the device 400.

Protective rings 440 can prevent false triggers of a proximity sensing operations that can occur when the device is placed on a conductive surface. As shown, protective rings 440 can be formed at opposing ends of the stylus to prevent the sense electrode 402 from contacting a surface. Protective rings 440 can be formed of an insulating material and/or be electrically insulated from sense electrode 402.

In one very particular embodiment, a housing 436 can be plastic and a sense electrode 402 can be a conductive rubber layer formed on the housing 436, close to the tip 404. While a sense electrode of a conductive polymer has been described, as noted above, any suitable conductive structure can be employed as a sense electrode, including but not limited to: a spring, metal ring, metal dots or any other conductive objects that can provide low impedance connection to the human body.

Figure 5:
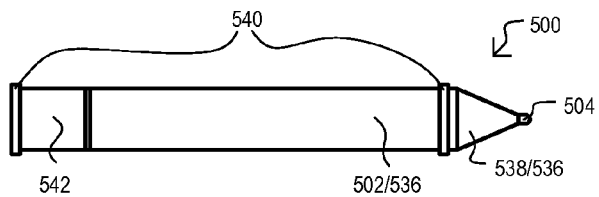
FIG. 5 is a side view of a stylus device according to another embodiment.

FIG. 5 is a side view of a stylus 500 according to another embodiment. A stylus 500 can include items like those in FIG. 4, including control electronics and a battery (not shown, but understood to be within the stylus body). Protective rings 540 can be included, as in the case of FIG. 4.

The embodiment of FIG. 5 can differ from that of FIG. 4 in that a housing 536 can be formed from a contiguous tube formed from a conductive material, such as a metal. In such an embodiment, any of a sense electrode 502, shield portion 538, and/or tip 504 can be part of a same unitary housing 536.

In an embodiment like that of FIG. 5, a stylus housing (e.g., case) can serve as both a sense electrode and a structure for containing control electronics and a power supply (e.g., battery). Such an arrangement can be cost effective to manufacture as it is a single component. Further, such a housing/sense electrode 502/536 can serve as an electro-magnetic interference (EMI) shield for components contained within. Accordingly, a stylus case can be used as proximity sensor and body electrode in the same time. When a human hand touches the stylus case, a sensed capacitance can increase many times. Such a large capacitance change can be detected with low power proximity sense circuits.

Referring still to FIG. 5, in embodiments having a unitary body/sense electrode structure, a grounding electrode 542 can be included. In proximity sensing operations, a grounding electrode 542 can be connected to a device ground to provide a return path for a proximity sensing current. In a particular embodiment, a grounding electrode 542 can be a ring shaped structure formed of a conductive material (e.g., metal) that is insulated from the housing/sense electrode 502/536.

Figure 6:
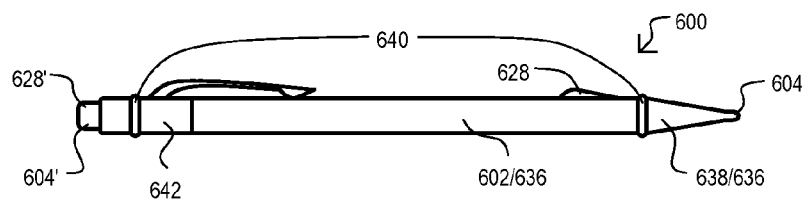
FIG. 6 is a side view of a stylus device according to a further embodiment.

FIG. 6 is a side view diagram of a stylus 600 according to a further embodiment. A stylus 600 can include items like those of FIG. 4, and such like items are referred by the same reference character, but with the leading digit being "6" and not "5". Stylus 600 can differ from that of FIG. 5 in that it shows a button 628, the operation of which can be detected by control electronics (not shown). Stylus 600 also shows a structure 604'/628' at an end opposite to tip 604. Such an end can serve as a second tip 604' and/or another button 628'. In an active mode, a second tip 604' can emit a position signal that is different from that of tip 604, and therefor distinguishable by a host (i.e., a host application can distinguish between tip 604 and second tip 604'). For example, tip 604 can be a "drawing" tip for an application, while second tip 604' can be a "erasing" (e.g., undo) tip for the application.

Having described various input devices, including styluses, methods of operation for such input devices will now be described.

FIG. 7 is a diagram showing main functions 700 of a human input device (HID) having a position indicating tip, according to one embodiment. Main functions 700 can include a start 702. A start 702 can include power-on and/or reset conditions. Hardware for the device can be initialized 704. A device can then enter a low power state 706. In a low power state, all or a portion of those circuit not used for proximity sensing can be placed into non-operational, low power modes. A device can then enter a low power state machine 708.

Upon entering the low power state machine 708 a device can be in a low power state 710 (i.e., OFF), and can be conceptualized as "sleeping". However, it is understood that proximity sensing can be operational to detect the proximity of a human body part (e.g., hand). In response to active events 712, a device can enter an active state (State=Active). Active events 712 can be events indicating operation of the device, and can include, but are not limited to: detecting the proximity of a body part (Proximity On); sensing force at the tip, or the activation of button. In a very particular embodiment, such events can generate interrupts for a processing section (e.g., CPU).

Upon entering the active state, a processing section can broadcast (714) to circuits the active states. Circuits that are in low power, or an off state, can turn on or power-up. In an active mode, a device can provide position indication or other functions. As but one example, unlike the low power state, a device can emit a position signal at one or more tips.

In response to low power events 716, a device can return to a low power state (State=Low Power). Low power events 716 can include no longer detecting the proximity of the body part (Proximity Off) and/or a timeout condition (e.g., lack of any active inputs for a set period of time).

FIG. 8 shows a low power state function 800 that can be included in embodiments. A device can be in a low power state 802. The state can be monitored 804. If a state is not active (No from 804), a device can remain in a sleep state 806, and return to monitoring a state. If state is active (Yes from 808), the low power state can be ended.

In some embodiments, a low power state function 800 can be executed by processor circuits in a low power mode. That is, minimal circuits can be deployed for this function for greatly reduced power consumption in the low power mode.

FIG. 9 shows dynamic tip voltage function 900 according to an embodiment. A function 900 can include measuring a tip force sensor 902. Such an action can include receiving or retrieving a force value from a force sensor at a tip. From a force value, a determination can be made as to whether the tip is pressed on a surface or not 904. If a tip is pressed (YES from 904), a voltage level of a position signal emitted at the tip can be set to a low value. If a tip is not pressed (NO from 904), a voltage level of a position signal emitted at the tip can be set to a high value.

Thus, when a device having a position indicating tip is away from a sense surface, a voltage at the tip can have a high magnitude, to aid in sensing a position (e.g., enable "hover" and other operations). However, once a tip is in contact with such a surface, a position signal voltage can be reduced, to thereby conserve power.

Having described various input devices, including styluses, proximity sensing operation for such devices will now be described.

Figure 10:
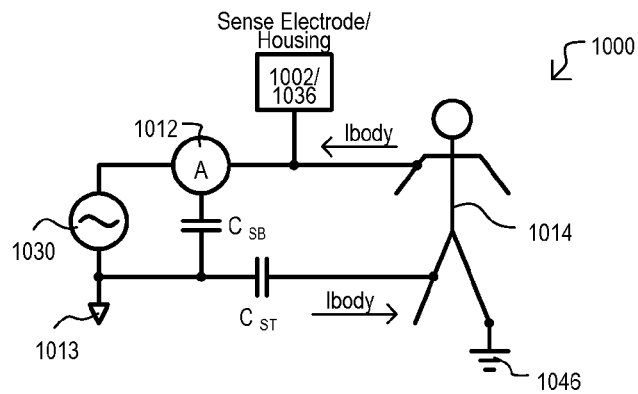
FIG. 10 is a diagram showing proximity sensing that can be included in embodiments.

FIG. 10 is a diagram showing an equivalent of a proximity sensing operation of a device, that can be included in embodiments.

A sense electrode/housing 1002/1036 can be driven with a time varying sense signal (e.g., from clock source 1030). A sense signal can create a proximity sensor current $I_{body}$. Current $I_{body}$ can be measured by a virtual current meter of proximity sense circuit 1012. A high current $I_{body}$ measure can indicate the sense electrode is being touched by a hand. A relatively small $I_{body}$ current measure can indicate that the proximity sensor is not touched.

Current $I_{body}$ can flow from a clock source 1030 through a sense electrode 1002 to the human body 1014, and back to the clock source 1030 via a capacitance $C_{ST}$. Thus, a capacitance $C_{ST}$ and the human body impedances can be the parameters that define the value of current $I_{body}$. In the particular embodiment shown, a sense signal from clock source 1030 can be the same for the sense electrode and body of a device.

A capacitance $C_{ST}$ can vary based on how many conductive objects connected to a device ground 1013 are close to the sense electrode 1002. In embodiments where a device body and sense electrode are a single metal piece (e.g., solid metal pipe, or similar), the proximity sense circuit 1012 can be can be shielded from a device ground 1013. In such a case, $C_{ST}$ can be small, and therefore $I_{body}$ is also small and the proximity of an object (e.g., hand) may not be detected. To address such a problem, embodiments can include a grounding electrode (e.g., 542 in FIG. 5) on a device body to create a path for $I_{body}$ current and give rise to high $C_{ST}$ values. Accordingly, inclusion of a grounding electrode can increase reliability of such proximity sensing.

It is noted that in an embodiment like that of FIG. 4 (i.e., housing of non-conductive material) can exclude a grounding electrode noted above. A human hand can have a high capacitive coupling to control electronics (including a proximity sense circuit) within the housing, thus $C_{ST}$ can be high, and therefor $I_{body}$ current can also be high.

Thus, according to embodiments, a human interface device having a tip, such as a stylus, can detect the proximity of a hand by an increase in capacitance at a sense electrode formed on, or making up, the housing of a device. It is understood that embodiments can utilize any suitable capacitance sensing techniques for proximity sensing operations.

Figure 11A:
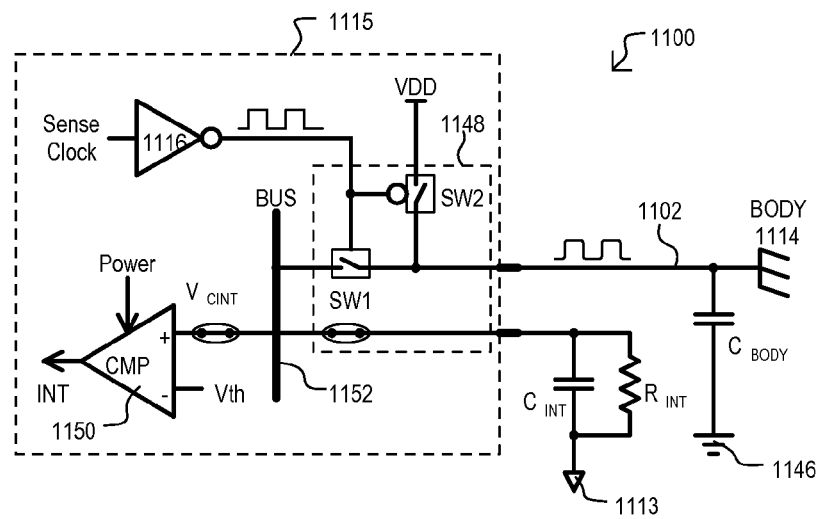
FIGS. 11A to 11C are diagrams showing a proximity sense circuit and operations according to embodiments.

FIG. 11A shows a proximity sense circuit 1100 according to one particular embodiment. A proximity sense circuit 1100 can include a sense signal driver 1116, switch network 1148, comparator 1150, and integrating components $C_{INT}/R_{INT}$. A sense signal driver 1116 can drive sense clock (Sense Clock) to generate control signals for switch network 1148. By operation of switch network 1148, a sense signal can be driven on the sense electrode 1102.

Switch network 1148 can selectively connect sense electrode 1102 to integrating components $C_{INT}/R_{INT}$ (via a bus 1152, in the embodiment shown). Such an operation can integrate a signal on the sense electrode (as modified by a capacitance $C_{BODY}$) to generate an integrated voltage $V_{CINT}$ on $C_{INT}$. Thus, $V_{CINT}$ can represent a measurement of $C_{BODY}$, which can exist between sense electrode 1102 and a body ground 1146.

Comparator 1150 can compare an integrated voltage ($V_{CINT}$) to a threshold voltage Vth to determine whether or not the device is in contact with a human body (e.g., is being handled). In some embodiments, a comparator 1150 can be dynamically powered for even greater reductions in power consumption. In a low power mode, a timer circuit can periodically provide power to a comparator 1150, which can then comparer $V_{CINT}$ to Vref. If proximity of a human body is not detected, the comparator 1150 can be returned to a low power state. In a very particular embodiment, comparator 1150 can operate with an 8 Hz scan rate, for a low power consumption rate (i.e., less than one uA operating current).

In operation, by action of switch network 1148, a sense electrode 1102 can switch between VDD (via switch SW2) and integrating capacitor $C_{INT}$ (via switch SW1). As noted, switch SW1 can connect sense electrode 1102 to a bus 1152. Switch SW2 can connect sense electrode to VDD. Switches SW1 and SW2 work in opposite phases. In some embodiments, integrating capacitor $C_{INT}$ can be connected continuously to bus 1152. Thus, a charge from VDD can be transferred to $C_{INT}$ through a $C_{BODY}$ capacitance. Integrating components $C_{INT}/R_{INT}$ can be connected between bus 1152 and a device ground 1113.

A comparator 1150 can be a low power comparator that generates an interrupt (INT) when $V_{CINT}$ falls below Vref. In response to such an interrupt, a processing section of the device (e.g., CPU) can wake up from a low power state, and place peripheral circuits into a low power mode. A reference voltage Vref can be generated by application of an existing clock to a low pass filter (LPF) internal to control electronics, or with a voltage divider (e.g., external resistive divider), or any other suitable reference voltage generator.

In one very particular embodiment, circuit elements within area 1115 can be part of a same integrated circuit.

Figure 11B:
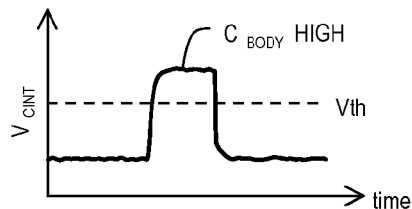
Figure 11C:
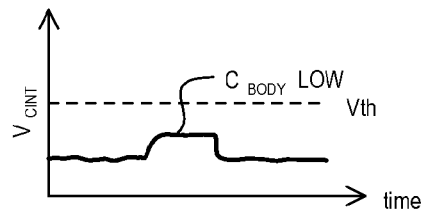

FIGS. 11B and 11C show proximity sensing operations for a proximity sensing circuit like that of FIG. 11A. When a device (e.g., stylus) is in a palm, $C_{BODY}$ can be relatively high and thus a voltage on $C_{INT}$ ($V_{CINT}$) is also relatively high. Thus, as shown in FIG. 11B, $V_{CINT}$ can be greater than Vth. A comparison operation (e.g., comparator 1150) can detect this difference, and generate a signal INT to indicate the device is being handled (i.e., initiate a switch to an active mode).

Conversely, when a device is not in, or ceases to be in a palm, $C_{BODY}$ can be relatively low and thus $V_{CINT}$ is also relatively low. Thus, as shown in FIG. 11O, $V_{CINT}$ can be less than Vth. A comparison operation can detect this difference, and provide an indication that the device is not being handled (i.e., maintain, or initiate a switch to a low power mode).

In one very particular embodiment, for a given sense signal and expected body capacitance ($C_{BODY}$), a value for resistor $R_{INT}$ and $C_{INT}$ can be selected to generate a voltage $V_{CINT}$ of about 0.3V to 0.4V, in the event the device is being handled ($V_{CINT}$ for Proximity On). In the event the device is not being handled ($V_{CINT}$ for Proximity Off), $V_{CINT}$ can be less than 0.3 V.

Figure 12:
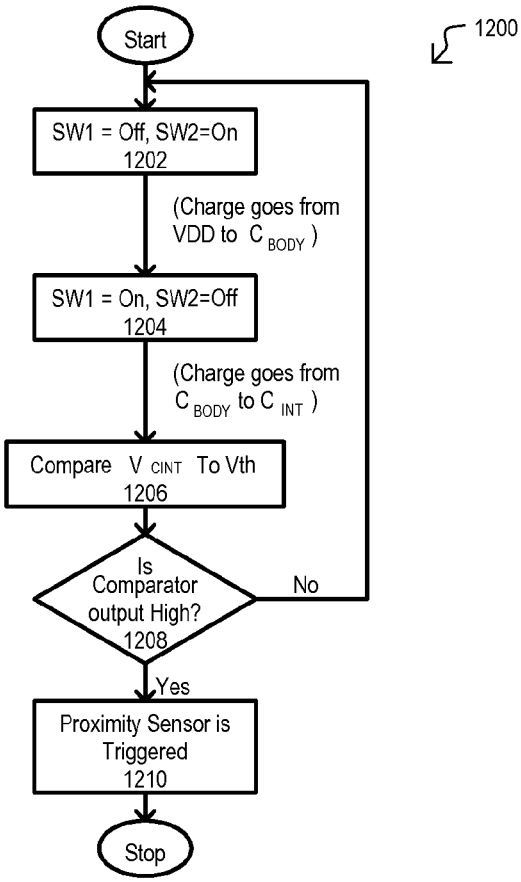
FIG. 12 is a flow diagram showing a proximity sensing operation for a circuit like that of FIG. 11A.

FIG. 12 shows a proximity sense circuit operation for the circuit of FIG. 11A. Switch SW1 can be off and Switch SW2 can be on 1202. As a result, $C_{BODY}$ can be charged to, or toward, the VDD level. Next, switch SW2 can be off and Switch SW1 can be on 1204. As a result, the charge on $C_{BODY}$ can be transferred to $C_{INT}$. A voltage on $C_{INT}$ ($V_{CINT}$) can be compared to a reference level Vth 1206. If a comparator output is not high (i.e., $V_{CINT}$<Vref) (No from 1208) switches can continue to switch as in 1202/1204. If a comparator output is high (i.e., $V_{CINT}$>Vref) (Yes from 1208) a proximity sense can be triggered 1210 (e.g., "Proximity On").

In embodiments in which a sense electrode and tip are part of the same conductive structure (e.g., body, housing), a sense signal (used for proximity sensing) and position signal (emitted from the tip) can be the same signal. Consequently, a voltage on integrating capacitance $C_{INT}$ can subtract from a voltage on a sense electrode. Thus, there can be some reduction in a voltage at a tip, as compared to the driving voltage level. In embodiments having components as noted above (voltage $V_{CINT}$ of about 0.3V to 0.4V in the event the device is being handled), a tip voltage can be about 0.3 V smaller than without proximity sensing, and can be asymmetrical. However, such a reduction can represent a 3% reduction, and so is not anticipated to present a significant impact on performance.

Figure 13A:
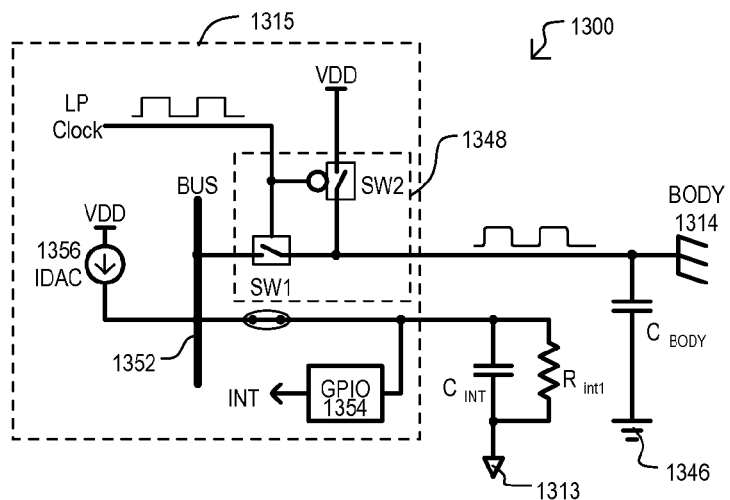
FIGS. 13A and 13B are diagrams showing a proximity sense circuit and operations according to another embodiment.

FIG. 13A shows a proximity sense circuit 1300 for a HID according to another embodiment. Proximity sense circuit 1300 can provide for a low power, small size circuit solution to sensing the proximity of a hand, or the like. Like the embodiment of FIG. 11A, proximity sense circuit 1300 can include a switch network 1348, and utilize integrating components $C_{INT}/R_{INT}$.

Proximity sense circuit 1300 can differ from that of FIG. 11A in that a switch network 1348 can be controlled by a "low power" clock (LP Clock) that can be a clock already present in the control electronics. Such a LP Clock can operate at a relatively low frequency, such as less than 100 KHz, or less than 50 KHz. In one very particular embodiment, LP Clock can be a 32 kHz clock.

Proximity sense circuit 1300 can also differ from that of FIG. 11A in that it may not include a comparator (e.g., 1150). Instead, an integrated voltage $V_{CINT}$ can be applied directly as an input to processing section. In the embodiment shown, $V_{CINT}$ can be applied via a general purpose I/O (GPIO) 1354 of a system.

In one very particular implementation of proximity sense circuit 1300, a LP Clock can be a 32 kHz internal low speed oscillator that can be used to control a switch network only in a low power mode for power consumption minimization. As noted above, a comparator can be replaced by using a GPIO input, for further reductions in power consumption. In such a particular embodiment, a GPIO input high level can be about 2V. In embodiments having an integral sense electrode/tip structure, such an arrangement can subtract the voltage (e.g., 2V) from a voltage at a tip. However, this does not adversely affect operations of the device, as the tip is not used for position indication in the low power (e.g., sleep) mode. Upon switching to an active mode, proximity sensing can be based on a lower $V_{CINT}$ (i.e., as shown in FIG. 11A). $R_{INT}$ can be selected to provide stable triggering via GPIO 1354.

Referring still to FIG. 13A, in particular implementations, a LP Clock can be subject to some variation, which can adversely affect the accuracy of proximity sensing. That is, different LP Clock frequencies can result in different integrated voltage ($V_{CINT}$) levels. To address such variations, a proximity sense circuit 1300 can include a compensation current digital-to-analog converter (IDAC) 1356.

IDAC 1356 can be connected to the bus 1352 shared by GPIO 1354 and switch network 1348. Prior to entering a low power mode, an IDAC 1356 can undergo a calibration procedure to ensure proper response for an actual LP Clock frequency. One example of an IDAC calibration routine for an embodiment like that of FIG. 13A is shown in FIG. 13B.

Figure 13B:
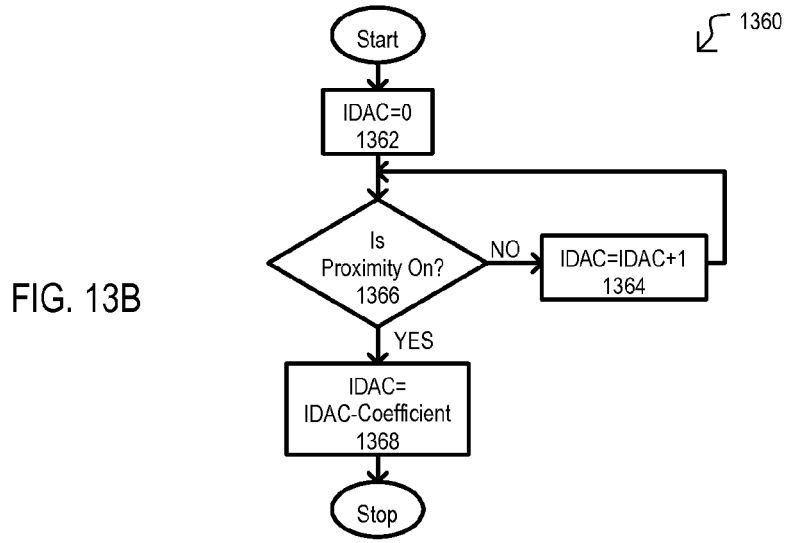

FIG. 13B shows an IDAC calibration 1360 according to an embodiment. An IDAC calibration 1360 can be performed upon power-on of a device and/or when switching from an active state to a low power state. A purpose of IDAC calibration 1360 can be to ensure that a voltage at $C_{INT}$ ($V_{CINT}$) is below a GPIO input threshold when the device is not touched.

A calibration procedure can start from minimal IDAC current that corresponds to deep, low power state (IDAC=0, 1362). From such an initial state, an IDAC value (and hence current) can be increased (IDAC=IDAC+1, 1364) while proximity has not yet been triggered (NO from 1366). When proximity is triggered (indicating the GPIO threshold point) (YES from 1366), a coefficient value can be subtracted from the current IDAC value (IDAC=IDAC−Coefficient, 1368). The coefficient value can establish the hysteresis between triggering the active and low power states (mode) based on proximity sensing. In this way, an IDAC response can be tuned to an actual LP Clock operation, decreasing the sensitivity of the proximity sense circuit 1300 to variations in a frequency of LP Clock.

As in the case of FIG. 11A, in one very particular embodiment, circuit elements of proximity sense circuit 1300 within area 1315 can be part of a same integrated circuit.

Figure 14:
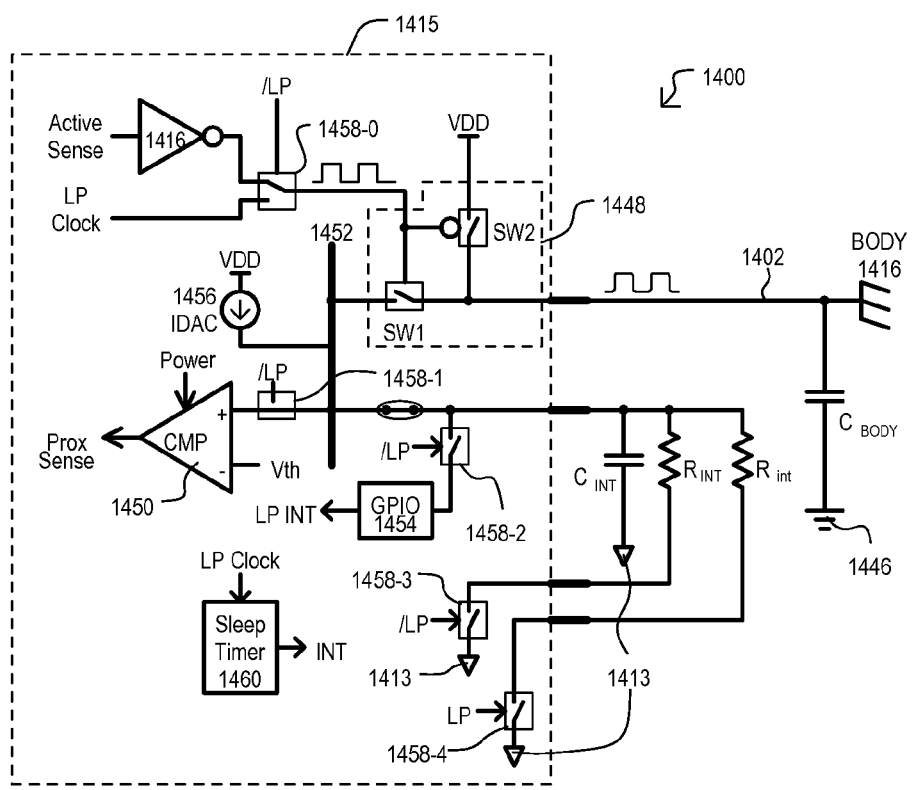
FIG. 14 is a block schematic diagram showing a proximity sense circuit according to a further embodiment.

FIG. 14 is a blocks schematic diagram of a proximity sense circuit 1400 according to a further embodiment. Proximity sense circuit 1400 can combine the features of those circuits shown in FIGS. 11A and 13A, and like items are referred to by the same reference character, but with the leading digits being "14" and not "11" or "13". The embodiment of FIG. 14 can switch between operations like those of FIG. 11A and those of FIG. 13A. More particularly, in a low power mode, proximity sense circuit 1400 can operate like that of FIG. 13A. In an active mode, proximity sense circuit 1400 can operate like that of FIG. 11A.

To provide for mode switching, proximity sense circuit 1400 can include switches 1458-0 to 1458-4. More particularly, in a low power mode, switch 1458-0 can connect a low power clock (LP Clock) as the signal which can drive a sense electrode 1402 (and tip, in some embodiments). Such a signal can have a relatively low frequency, as described in conjunction with FIG. 13A. Switch 1458-1 can be open, isolating comparator 1450 from bus 1452. Switch 1458-2 can be closed, connecting GPIO 1454 to bus 1452. Thus, GPIO 1454 can provide a proximity detection result. Switch 1458-4 can be closed, so that integration is performed with $C_{INT}$ and $R_{int}$ Switch 1458-3 can be open, so that $R_{INT}$ is not included in an integration operation. That is, a value for $R_{int}$ is selected for integration according to signal LP Clock. Proximity sensing can then occur as described for FIG. 13A.

Also in the low power mode, comparator 1450 and driver 1416 can be disabled, for further power reduction. Further, IDAC 1456 can be included to compensate for variations in LP Clock, as described in conjunction with FIG. 13B.

In an active mode, switch 1458-0 can connect an active sense signal (Active Sense) as the signal which can drive a sense electrode 1402 (and tip, in some embodiments). Such a signal can have a relatively high frequency, as compared to LP Clock. Switch 1458-1 can be closed, connecting comparator 1450 to bus 1452, while switch 1458-2 can be open, isolating GPIO 1454 from to bus 1452. Thus, comparator 1450 can provide a proximity sensing result by comparing the voltage across $C_{INT}$ to Vth. Switch 1458-4 can be open and switch 1458-3 can be closed, so that integration is performed with $C_{INT}$ and $R_{INT}$. That is, $R_{INT}$ is selected for integration according to the higher frequency signal Active Sense. Proximity sensing can then occur as described for FIGS. 11A to 12.

Referring still to FIG. 14, a proximity sense circuit 1400 can further include sleep timer 1460. In one embodiment, a sleep timer 1460 can periodically generate an interrupt that can "wake up" a processing section (not shown), which can then scan GPIO 1454 to determine if the device is being handled (i.e., GPIO high).

Figure 15:
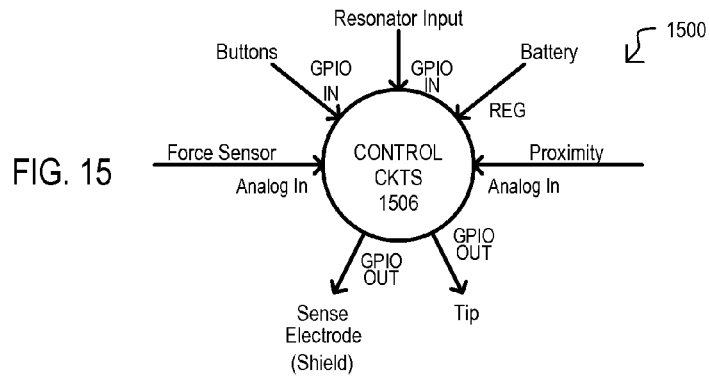
FIG. 15 is a diagram showing control circuit functions of a HID according to an embodiment.

FIG. 15 shows control circuits 1506 of a HID according to one particular embodiment. Control circuits 1506 can operate on a number of received inputs and generate outputs. In the embodiment shown, the inputs can include: a force sensor value (Force Sensor), proximity sensing result (Proximity), battery voltage (Battery), button states (Buttons), and a resonator input (Resonator Input). A Force Sensor value can be generated in response to a sensed force at a tip. In the embodiment shown, the value can be an analog value (e.g., current or voltage). Force sensing can utilize any suitable technique, including piezoelectric or mechanical sensing, as but two examples. A proximity sensing result can be a capacitance sensing result, as described herein or equivalents. Such a result can be a voltage (e.g., $V_{CINT}$) or a signal generated from a sensing (e.g., interrupt). A battery voltage can be used to detect a low voltage state, and implement a boosting operation and/or indication in response to such a state. Buttons can be the state of buttons on the device, and can take the form of any of those described herein. A resonator input can establish a periodic signal from which a sense signal (applied to a sense electrode) and/or position signal (applied to a tip) can be generated. In some embodiments a resonator input can be from a crystal based oscillator circuit.

In the embodiment shown, the outputs can include: a sense electrode output and a tip output. A sense electrode output can drive a sense electrode to enable proximity sensing as described herein. A tip output can be a position signal that can indicate the position of a tip on a sensing surface (e.g., host array). As noted above, in some embodiments, a sense signal and position signal can be the same. Further, a position signal emitted at a tip can have data (e.g., force data, battery data) encoded therein.

As understood from above, a human interface device according to embodiments herein can include a processing section (e.g., CPU) for controlling operations of the device. According to embodiments, a processing section can perform any of the following functions: initialization upon power-on or reset, handling proximity sense results; reconfiguring the device between active an low power modes; measuring force; handling force sensor interrupts; writing data (e.g., force) data to a modulator (to modulate the position signal); changing a boost voltage; changing a state of the sense electrode (e.g., shield); monitoring a battery voltage; and monitoring button states.

In a particular embodiment, processing section functions, except initialization, can be called from interrupt routines. This can minimize processor active time and power consumption. In essence, a processing section can be maintained in a low power (e.g., sleep) mode, wake up upon interrupt, executing the interrupt routine as fast as possible, and then return to the low power mode.

Figure 16:
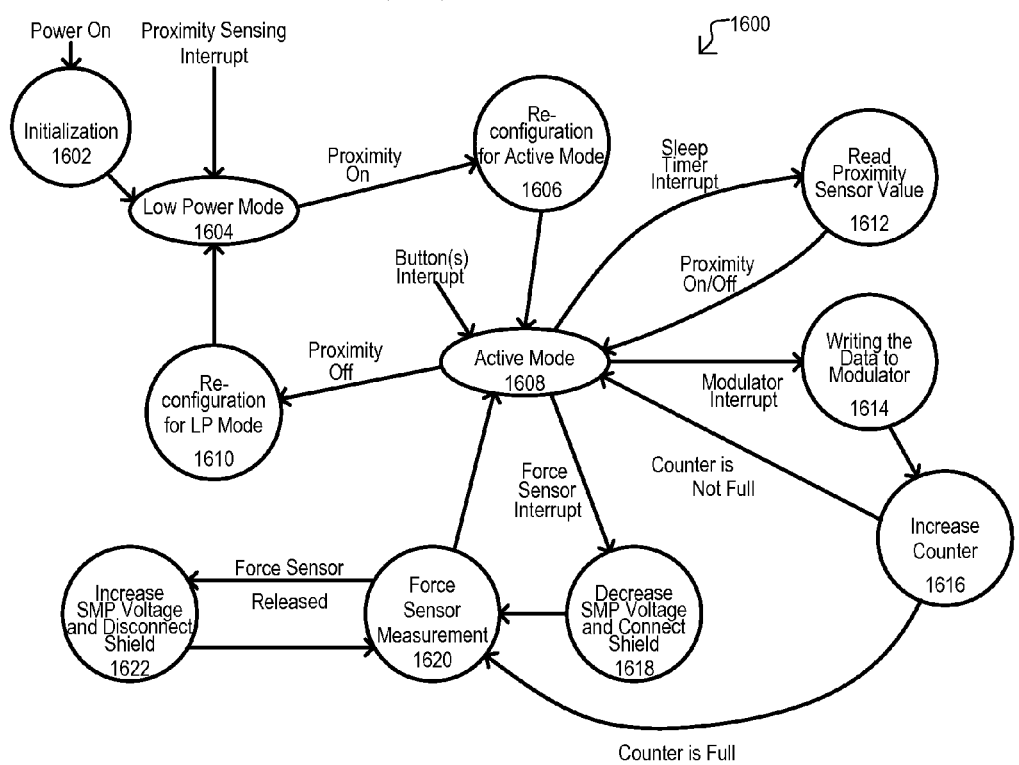
FIG. 16 is state diagram showing operations of a processing section of an HID according to an embodiment.

FIG. 16 shows processing section functions 1600 according to an embodiment. Processing section functions 1600 can be functions executed by a processing section of an HID, such as stylus, as described herein. In the embodiment of FIG. 16 it is assumed that the processing section is a CPU.

Upon power on, a CPU can execute a chip initialization and configuration procedure (1602). Afterward, a CPU enters a low power mode (1604). A Proximity On interrupt (Proximity On), can cause a transition from low power mode to the active mode. More particularly, circuits can be re-configured for active mode (1606) and then the CPU can enter the active mode (1608). Conversely, once in the active mode, a Proximity Off interrupt (Proximity Off), can result in circuits being re-configured for low power mode (1610) and then the CPU can return to the low power mode (1604). Further, when in the low power mode, in response to a Proximity Sensing Interrupt, CPU can check a proximity value to determine if proximity has been sensed.

As shown in FIG. 16, in response to button actions (Button (s) Interrupts), the CPU can enter the active mode (1608).

In the active mode (1680), in response to a Sleep Timer Interrupt, a read of a proximity value can be made (1612). If Proximity On is detected, the CPU can remain in an active mode. If Proximity Off is detected, the CPU can re-configure to the low power mode (1610).

In the active mode, a Force Sensor Interrupt can indicate a tip of the device has contacted a surface. In response to such an interrupt, a sense signal (SMP) voltage can be decreased, and a sense electrode (shield) can be connected to ground (1618). A force sensor measurement can be made (1620). If the force is maintained, a CPU can remain in the active mode 1608. If the force sensor indicates release (i.e., tip no longer in contact with surface), CPU a sense signal (SMP) voltage can be increased, and a sense electrode (shield) can be disconnected from ground (1622) and connected to the tip (or connected to receive the same signal as the tip). A force sensor measurement can be made (1620) once again.

In the active mode 1608, a Modulator Interrupt can indicate a modulator is ready to receive data for write (i.e., data to be modulated into the position signal). In response to such an interrupt, data can be written to the modulator 1614. A counter can be incremented (1616). If the counter has not reached a limit (Counter is Not Full), a CPU can return to the active mode (1608). But if a counter has reached a limit (Counter is Full), a force sensor measurement can be made (1620).

In one embodiment, force sensor measurements can be skipped if a device is in a hover mode (active but tip is not in contact with a surface).

Figure 17:
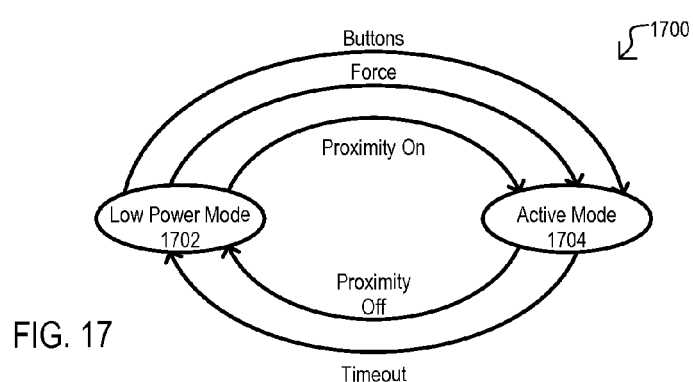
FIG. 17 is state diagram showing power control operations of a HID according to an embodiment.

FIG. 17 is a state diagram 1700 showing power control operations of a device according to another embodiment. Operations shown in FIG. 17 can be realized by a processing section included within the control electronics of a device, as described herein, or equivalents.

A device can have two states: a low power state (1702) and an active state (1704). Upon power-on or reset, a device can go into the low power state (1702). If a sense electrode is touched (Proximity On), the device can switch to the active state (1704). If the device is released (Proximity Off), the device can return back to the low power state (1702). If the device is in the active state for longer than a set period of time, and no tip force or buttons action occur during this time (Timeout), the state machine can return to the low power state (1702). Such an action can utilize a timeout timer. Such a timeout timer can save power if a user holds the device over a long period of time without action (e.g., falls asleep with the stylus in hand).

In one particular embodiment, after entering the low power state from a timeout condition (Timeout), a device cannot enter the active state via proximity sensing. Thus, in the embodiment shown, if the low power state is entered due to Timeout, the device can enter the state only from button actions (Buttons) or a force sensed at the tip (Force).

In addition or alternatively, if a device is a low power state not due to a timeout condition, a device can transition to an active state only upon proximity sensing (Proximity On) (i.e., not in response to button or tip action, without proximity). Thus, in in such a low power state, and button or tip action occurs, a device can initiate low power proximity sensing.

Figure 18:
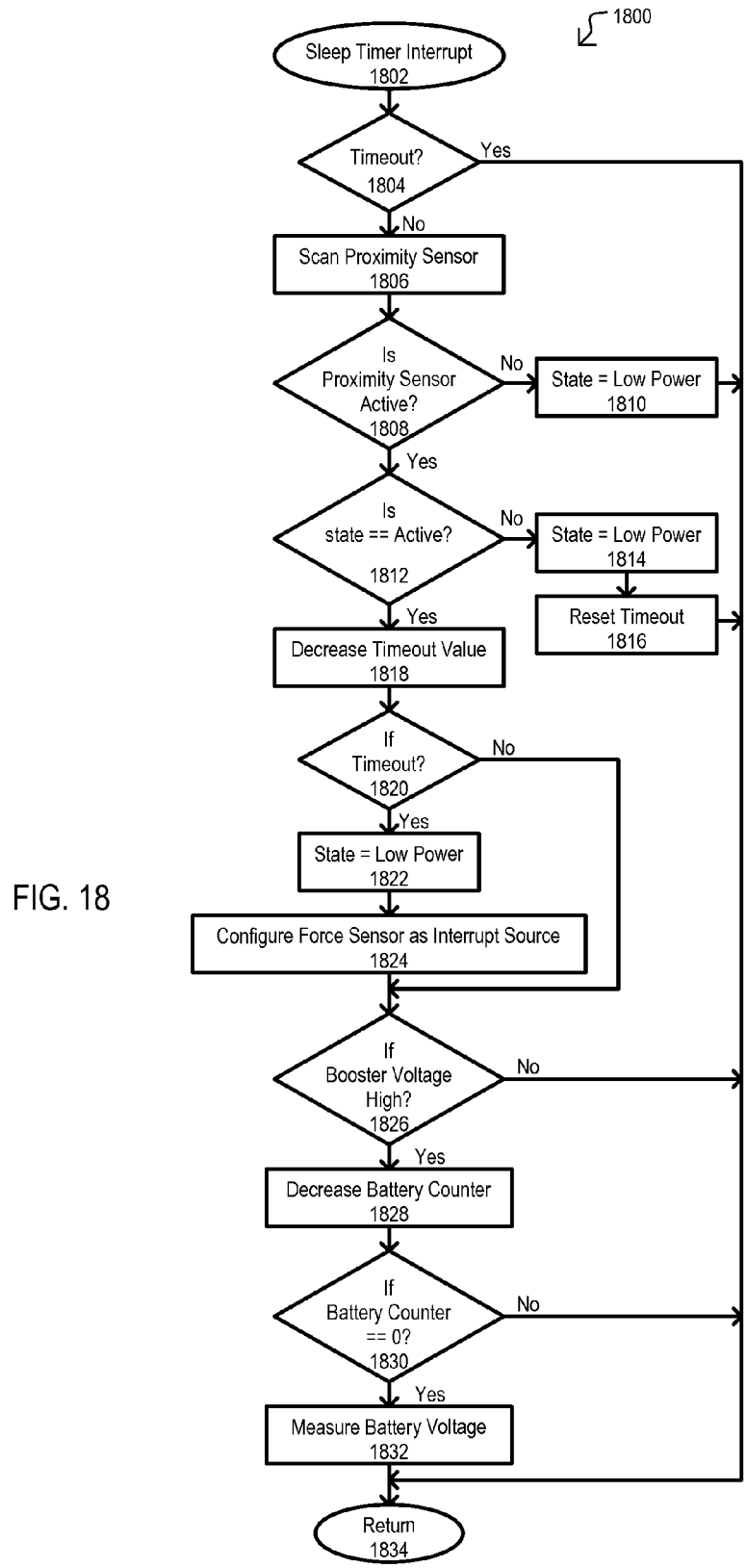
FIG. 18 is a flow diagram of a sleep timer interrupt service routine (ISR) that can be included in embodiments.

As was shown in FIG. 16, embodiments can operate according to a sleep timer interrupt. A sleep timer interrupt service routine (ISR) 1800, according to one embodiment, is shown in FIG. 18.

A sleep timer ISR 1800 can occur periodically with a sleep timer interrupt (1802). In one particular embodiment, such a routine can be performed once a second. At the beginning of the routine a timer (e.g., watchdog timer) can be reset. A device can determine if a timeout condition has occurred (1804). If a timeout condition has occurred (Yes from 1804), the routine returns to main operations (1834).

If a timeout condition has not occurred (No from 1804), a proximity sensing operation can be executed (e.g., a sense electrode can be sensed) (1806). If no proximity is detected (No from 1808), a lower power state can be entered (1810), and the routine can return to main operations (1834). If proximity is detected (e.g., the device is being handled) (Yes from 1808), it can be determined if the state is active (1812). If the state is not active (No from 1808), a state can be set to the low power state (1814), a timeout value can be reset (1816), and the routine can return to main operations (1834).

If a state is active (Yes from 1812), a device can decrease a timeout value (1818) and determine if timeout has occurred (1820). If timeout has not occurred (No from 1820), a booster voltage level can be checked (1826). If timeout has occurred (Yes from 1820), a state can be set to low power (1822), and a force sensor (and/or buttons) can be configured as an interrupt source (1824). Thus, a touch (proximity sensing) will not wake the device, as it has timed out while being held. A routine can then proceed to a booster voltage level checked (1826).

If a booster voltage level is not high (No from 1826), the routine can return to main operations (1834). If the booster voltage level is high (Yes from 1826), a battery voltage may or may not be measured based on a battery timer. That is, while a sleep timer ISR 1800 can occur with some frequency (e.g., once a second), a battery measurement can be made with less frequency. In the embodiment of FIG. 18, if a battery counter has not counted down (No from 1830), the routine can return to main operations (1834) without making a battery measurement. However, if a battery counter has counted down (Yes from 1830), a battery voltage measurement can be made (and the battery counter reset), and the routine can return to main operations (1834).

Figure 19:
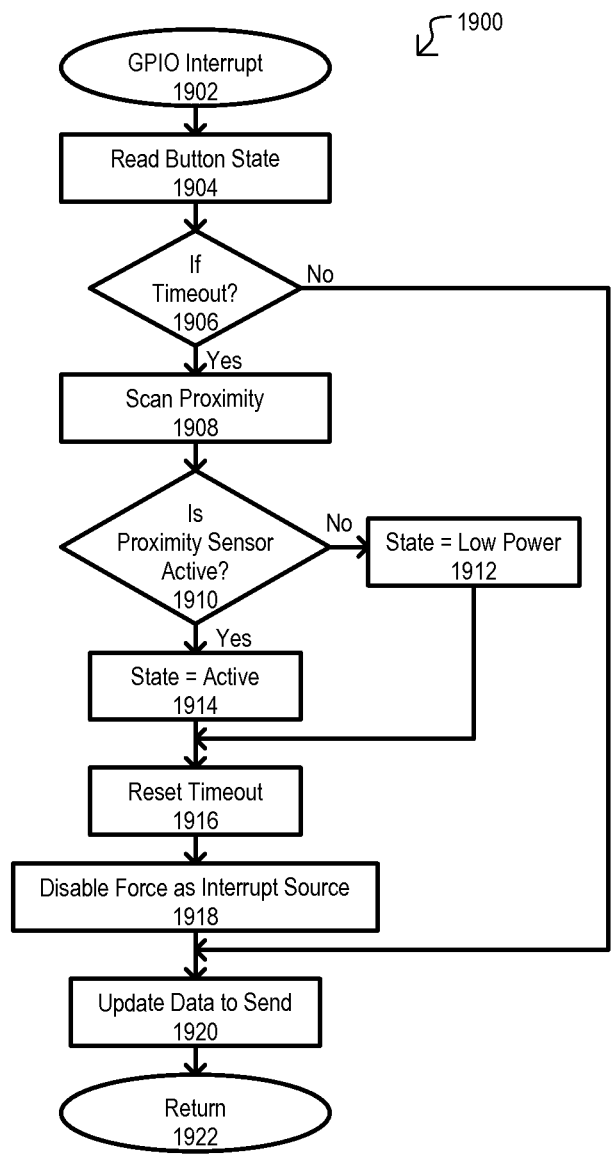
FIG. 19 is a flow diagram of an input ISR that can be included in embodiment.

FIG. 19 shows a GPIO interrupt service routine 1900, which can service button actions of a device. In the particular embodiment shown, force interrupts (i.e., force detected at a tip) can occur on a timeout basis only. Upon a GPIO interrupt (1902) button states can be scanned (1904) to acquire data to send. If a timeout condition has not occurred (No from 1906), the data to be sent can be updated with the latest button(s) state, and the routine can return to main operations (1922).

If a timeout condition has occurred (Yes from 1906), a proximity scan operation can occur (1908). If a proximity sensor (e.g., sense electrode) is not active (No from 1910), a state can be set to low power (1912), and a timeout value can be reset (1916). If a proximity sensor is active (Yes from 1910), a state can be set to active (1914), and force as an interrupt can be disabled (1918). Data to be sent can be updated with the latest button(s) state, and routine returns to main operations (1922).

Figure 20:
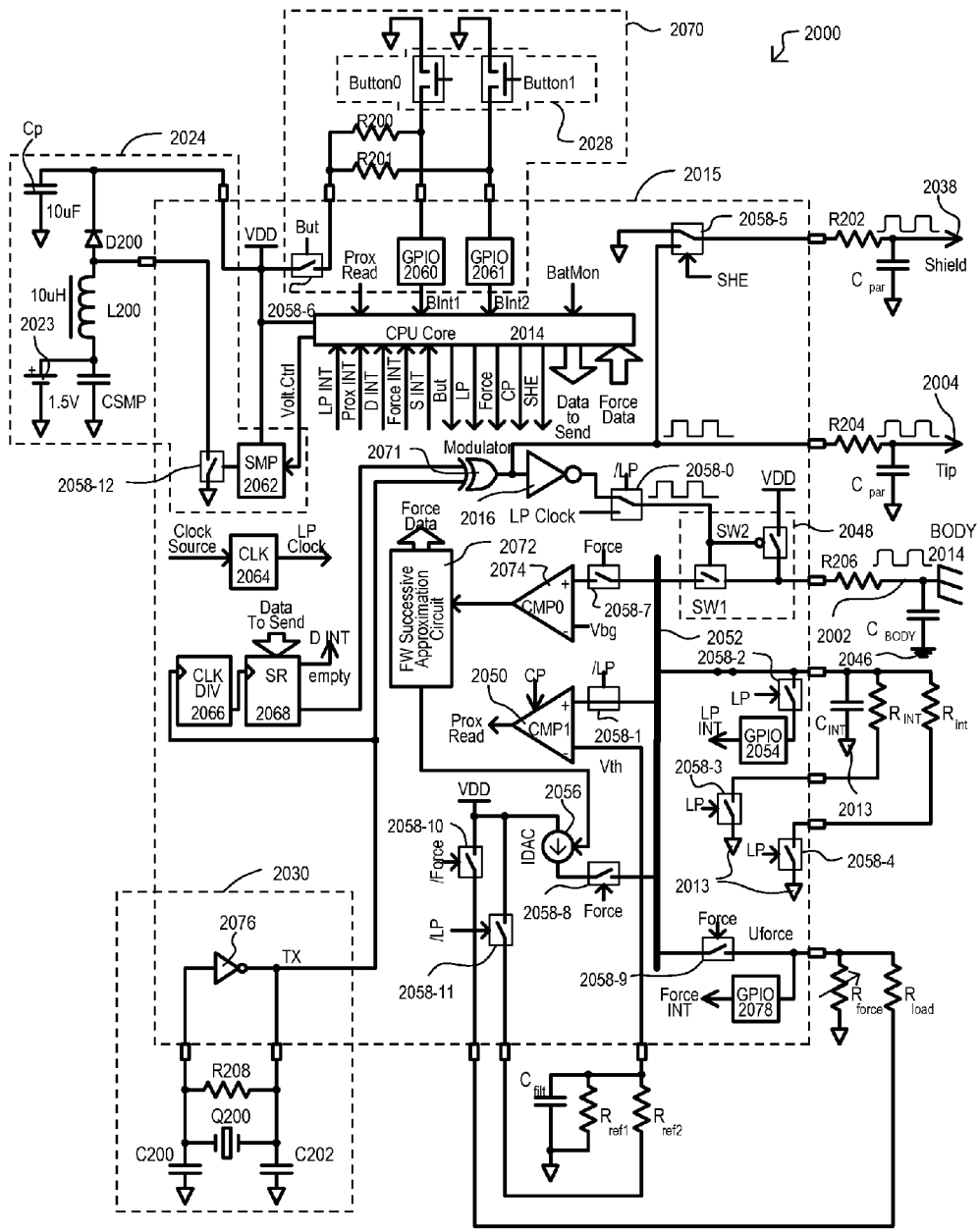
FIG. 20 is a block schematic diagram of HID according to one particular embodiment.
Figure 21A:
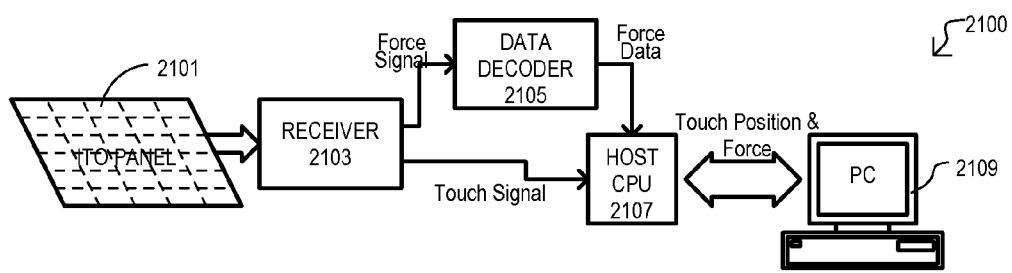
FIGS. 21A and 21B are block diagrams showing a conventional self-synchronized active stylus (SSAS) system.
Figure 21B:
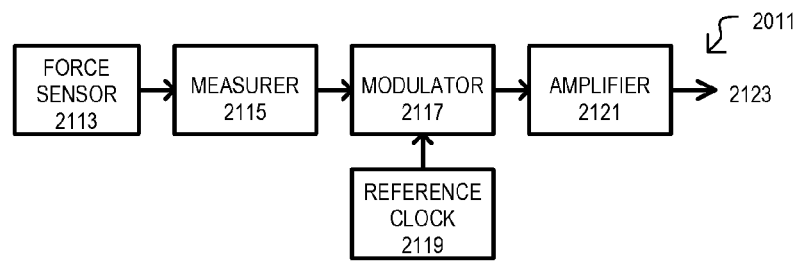

FIG. 20 shows a human interface device 2000 according to an embodiment. In one particular embodiment, a device 2000 can be a SSAS. The control electronics 2015 include a proximity sense circuit like that of FIG. 14, and like items are referred to by the same reference character but with the leading digits being "20" instead of "14".

Accordingly, in a low power mode, control electronics 2015 can provide low power proximity sensing via a GPIO 2054 and low power clock (LP Clock) applied via switch 2058-0, while in an active mode, proximity sensing can be provided via comparator 2050 and a higher frequency (and possibly modulated) sense signal applied via driver 2016. The embodiment of FIG. 20 also shares bus 2052 with a force sensing circuit, and so includes switch 2058-8 that can isolate IDAC 2056 from the bus when force sensing is taking place.

Further, a reference voltage Vth, used by comparator 2050 in the active mode, can be generated by switch 2058-11 connecting VDD to voltage divider/filter formed by $C_{filt}$, $R_{ref1}$, and $R_{ref2}$. This ratiometric approach can provide an accurate reference voltage despite variations in power supply.

Various portions of the control electronics 2000 will now be described according to functional groups.

A booster circuit 2024 can generate a DC supply voltage VDD from a lower voltage power source. In the embodiment shown, a booster circuit 2024 includes switching capacitor CSMP, battery 2023, inductor L200, diode D200, power supply capacitor Cp, control circuit 2062, and switch 2058-12. A CPU Core 2104 can provide a voltage control signal Volt.Ctrl to a switching circuit 2062. Switching circuit 2062 can control a rate at which switch 2058-12 operates to establish the level of VDD. It is understood that other embodiments can include other types of booster circuits, or alternatively, no booster circuit if the other components can operate at the voltage supplied from a power source (e.g., battery).

A button section 2070 can include switch 2058-6, buttons 2028, resistors R200/R201, and GPIOs 2060, 2061. Switch 2058-6 can enable buttons 2070 by providing power thereto. By way of GPIOs 2060/2061, buttons 2028 can generate interrupts Bint1/Bint2 to CPU core 2014. It is understood that other embodiments can include other types of buttons different from mechanical buttons, such as capacitance sense buttons, as but one example.

A shield control section can include switch 2058-5, for dynamic switching of a shield 2038. In one embodiment, in one mode (e.g., active hover), switch 2058-5 can enable shield 2038 to be driven by a sense signal. In another mode (e.g., active tip in contact with surface), a shield 2038 can be connected to a device ground. Alternate embodiment can include no shield switching.

A CPU Core 2014 can control operations of a device 2000. In the embodiment shown, a CPU core 2014 can receive as inputs, a boosted power supply voltage (VDD), a proximity read input (received from a comparator 2050 proximity sense circuit), button interrupts (Bint1, Bint2), a battery monitor (BatMon), a low power proximity sense interrupt (LP INT) from GPIO 2054, a data ready interrupt (D INT), a force interrupt (Force INT), a sleep interrupt (S INT), and force data (Force Data). A CPU Core 2014 can output a button control (But) (to enable button operations), a low power mode control (LP), a force read mode signal (Force), comparator power control (CP), shield control signal (SH), and data to send (Data to Send). CPU core 2014 represents but one type or processing section. Alternate embodiments can include application specific logic, programmable logic, or combinations thereof.

A clock source 2024 can include crystal based resonator circuit that includes crystal Q200, capacitors C200/C202, resistor R208, and driver 2076. A periodic signal TX can be generated having a frequency based on the selected components. It is understood that other embodiments can include any other suitable clock source circuit.

A device 2000 can include force sensing at a tip location. In the embodiment shown, force sensing can be based on a variation in resistance $R_{force}$, resulting from force at a tip 2004. Further, device 2000 can convert an analog value of force into a digital value, which can then be encoded into a position signal transmitted at a tip.

When force sensing is enabled, switch 2058-10 can connect VDD to a voltage divider $R_{load}/R_{force}$. Thus, changes in force ($R_{force}$) can result in changes in a force measurement voltage Uforce. A force interrupt (Force INT) can be generated by detecting a change in Uforce at GPIO 2078.

In addition, a voltage Uforce can be connected to bus 2053 by switch 2058-9, as an analog input voltage representing a force value. Comparator 2074 can operate in conjunction with successive approximation (SAR) circuit 2072, to generate a digital value representing a detected force (Force Data). In more detail, a reference voltage Vbg at comparator 2074 can be varied in a sequence of compare operations, to arrive at a digital value. It is understood that other embodiments can utilize any other suitable analog-to-digital conversion to arrive at a digital force value.

CPU Core 2014 can receive Force Data, and format it for an appropriate modulation technique and/or communication protocol, and output such data values as Data to Send. It is understood that Data to Send can include data in addition to force data, such as status data of the device (e.g., battery level, device ID information, button state, etc.).

As noted above, a device 2000 can modulate a position signal emitted at a tip 2004 to enable the transmission of data to a host device. In the particular embodiment of FIG. 20, modulation circuits can include shift register (SR) circuit 2068, clock divider 2066, and modulator 2071. Data to Send can be received by SR circuit 2068, which can output such data, bit by bit, based on a divided version of signal TX. A logical XORing of TX with the output from SR circuit 2068 can result in the modulation of the TX signal, which can be output as an active mode position signal, which can selectively be driven at a shield 2038, tip 2004, and control proximity sensing via switch group 2048.

FIG. 20 also includes a clock circuit 2064, which can receive an existing clock signal of the device (Clock Source), and generate therefrom the low power clock (LP Clock).

In one embodiment, all circuits within section 2015 can be part of the same integrated circuit, for an advantageously compact design for inclusion in the housing for the device. More particularly, such a compact form is advantageous for maintaining a slim stylus design. In one very particular embodiment, section 2015 can be implemented with a PSoC® Programmable System-on-Chip device, manufactured by Cypress Semiconductor Corporation, having offices in San Jose, Calif., U.S.A.

In an alternate embodiment, a reference voltage Vref for active mode proximity sensing can be formed by a clock divider circuit having pulse width modulation (PWM) and an internal low pass filter (LPF) block. A value of Vref can be adjusted according to the PWM of the signal applied to the LPF block. However, such an approach can introduce undesirable rippling in a power supply voltage, particularly when lower frequency clocks (i.e., kHz) are used.

In some embodiments, a voltage of battery 2024 can be monitored, and a resulting battery level can be stored as a value in a register readable by CPU Core 2014. When a battery voltage falls to some low level, a booster circuit 2024 may not be able to boost the voltage to a desired level. For example, if battery 2023 is a 1.5V battery and VDD is about 5V, once the battery falls below 1V, booster circuit 2024 may no longer be able to achieve the 5V level. When a booster circuit 2024 cannot achieve a desired level, a "low battery" bit can be set. This bit can be read in proximity scan procedure. In some embodiments, such a bit can be modulated into a sense signal to enable a host device to indicate a battery is low. In addition or alternatively, a local low battery indication can be provided on the device itself (e.g., visual or audio indication).

Embodiments as described herein can provide one or more power management features for conserving power in a human interface device, such as a stylus. In particular embodiments, a position signal emitted at a tip can be turned on/off and/or the magnitude/frequency of such a signal can be varied according to mode of operation. This is in sharp contrast to conventional styluses that have an "always on" tip signal.

Embodiments can include proximity sensing at locations where the device is handled. This can enable low power modes when the device is not being used and/or switching to low power modes after a period of inactivity. This is contrast to conventional styluses that are simply turned on or off.

Embodiments of the invention can encode power status data into a position signal emitted from a tip. For example, a battery level indication can be emitted, enabling a host device to let a use know that battery replacement (or a recharge operation) should take place in the near future.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A device, comprising:
a body comprising an elongated housing with at least a first conductive tip formed at a distal end and at least one sense electrode on the body;
a capacitance sense circuit disposed within the housing and configured to sense a capacitance of the sense electrode to generate a proximity result in response to contact with a human body; and
a signal generator circuit disposed within the housing and configured to activate a first position signal in response to the proximity result and a second position signal, different from the first position signal, in response to sensing a force at the tip, the first and second position signals being driven at the tip of the device, and the first position signal having a greater magnitude than the second position signal.

2. The device of claim 1, wherein:
the body comprises a single structure that includes the sense electrode.

3. The device of claim 1, wherein:
the body comprises a non-conductive material and the sense electrode comprises a conductive material formed on the non-conductive material.

4. The device of claim 3, wherein:
the sense electrode comprises a conductive polymer.

5. The device of claim 1, wherein:
the capacitance sense circuit comprises an integrator circuit that integrates sense signal; wherein
the sense signal and first and second position signals are time varying signals.

6. The device of claim 5, wherein:
the sense signal is selected from the first or second position signals.

7. The device of claim 5, wherein:
the sense signal has a lower frequency than the first and second position signal in at least one mode.

8. A device, comprising:
a body comprising an elongated housing with at least a first conductive tip formed at a distal end and at least one sense electrode on the body;
a sense circuit disposed within the housing and configured to detect a human body in proximity to the sense electrode to generate a proximity result; and
a controller configured to switch the device between a low power mode and an active mode in response to at least the proximity result;
a signal generator circuit configured to drive the tip with a first position signal or a second position signal, the second position signal being driven in response to a force applied at the tip of the device; wherein
the device consumes less power in the low power mode as compared to the active mode, and
the first position signal has a greater magnitude than the second position signal.

9. The device of claim 8, further including:
the signal generator circuit is further configured to drive the first position signal at the tip of the device in the active mode, and to disable the first position signal at the tip in the low power mode.

10. The device of claim 9, further including:
a modulator circuit configured to modulate at least the first position signal according to data values in the active mode, the modulator circuit being disabled in the low power mode.

11. The device of claim 8, further including:
a force measurement circuit configured to generate a force value according to a mechanical force applied at the tip of the device in the active mode, the force measurement circuit being disabled in the low power mode.

12. The device of claim 11, further including:
the first and second position signals are time varying signals.

13. The device of claim 11, further including:
a shield electrode formed on the housing adjacent to the tip; and
the signal generator circuit drives the shield electrode and tip with the second position signal when a force is detected at the tip, and drives the tip with the first position signal and grounds the shield electrode when the force is not detected at the tip.

14. The device of claim 8, further including:
the signal generator circuit is further configured to drive the sense electrode and the tip with the first position signal in the active mode, and in the low power mode, drive the sense electrode with a sense signal and not drive the tip with the first position signal.

15. The device of claim 8, further including:
at least one button; and
the controller is configured to switch the device between the low power mode and the active mode in response to at least an activation of the button.

16. A method, comprising:

capacitance sensing a proximity of at least a portion of a human body with a sense electrode formed on a surface of an input device, the input device having an elongated, hollow body and at least one distal tip;

selectively generating a position signal at the tip with circuits within the body;

switching between a lower power mode and an active mode in response to the capacitance sensing of the sense electrode with circuits within the body; and switching from a generating a first position signal at the tip to generating a second position signal at the tip in response to sensing a force at the tip; wherein the device consumes less power in the low power mode as compared to the active mode, and the first position signal has a greater magnitude than the second position signal.

17. The method of claim 16, further including:

generating the position signal at the tip in the active mode and not generating the position signal at the tip in the low power mode.

18. The method of claim 16, further including:

in the active mode, sensing a force applied at the tip;

in response to one type of sensed force, generating the first position signal at the tip and at a shield electrode, the shield electrode being different than the sense electrode; and in response to another type of sensed force, generating the second position signal at the tip and disconnecting the shield electrode from any position signal.

19. The method of claim 16, further including:

after switching to the active mode, returning to the low power mode if a proximity of at least a portion of the human body is not sensed for a predetermined period of time.

* * * * *